United States Patent [19]

Bailey

[11] 4,256,982

[45] Mar. 17, 1981

[54] ELECTRIC PULSE SHAPING CIRCUIT

[75] Inventor: Ronald B. Bailey, Erie, Pa.

[73] Assignee: General Electric Company, Erie, Pa.

[21] Appl. No.: 35,351

[22] Filed: May 2, 1979

[51] Int. Cl.³ .................... H03K 5/07; H03K 5/01; H03K 3/01
[52] U.S. Cl. ........................... 307/268; 307/252 J; 328/67
[58] Field of Search ........... 307/261, 268, 265, 252 J, 307/252 N; 328/67

[56] References Cited

U.S. PATENT DOCUMENTS

| | | | |
|---|---|---|---|
| 3,423,664 | 1/1969 | Dewey | 363/51 |
| 3,558,983 | 1/1971 | Steen | 361/58 |
| 3,646,578 | 2/1972 | Gregory | 307/252 J |
| 3,681,677 | 8/1972 | Badal | 307/268 X |
| 3,887,836 | 6/1975 | Leete | 315/207 |

FOREIGN PATENT DOCUMENTS 1948257  4/1971  Fed. Rep. of Germany ........... 307/268

OTHER PUBLICATIONS

"Gate Trigger Characteristics, Ratings and Methods" General Electric SCR Manual, pp. 71-122, Fifth Ed., 1972.

*Primary Examiner*—John Zazworsky
*Attorney, Agent, or Firm*—Albert S. Richardson, Jr.

[57] ABSTRACT

A pulse shaping and amplifying circuit is formed by connecting a capacitor in series with the primary winding of a pulse transformer, connecting normally open switching means in parallel with the capacitor and primary winding, and connecting this parallel combination through a series inductor to a source of d-c control power, whereby the capacitor accumulates a charge from the control power source and then, during periods when the switching means is closed, discharges through the switching means and the primary winding. During its closed periods the switching means also conducts current from the control power source through the inductor, but when the switching means is opened the current in the inductor is transferred to the capacitor and the primary winding and thereby assists recharging of the capacitor. The pulse transformer is provided with at least one secondary winding which is connected to a load circuit by a full wave rectifier means comprising a first diode poled to conduct load current when capacitor discharge current is flowing in the primary winding and serially interconnected second and third diodes poled to conduct load current when capacitor charging current is flowing in the primary winding. Another capacitor is connected in series with one of the second and third diodes across the load circuit, whereby it ensures continuous load current after the first half cycle of operation of the pulse shaping circuit if the closed periods of the switching means recur at a sufficiently high frequency.

4 Claims, 2 Drawing Figures

ELECTRIC PULSE SHAPING CIRCUIT

BACKGROUND OF THE INVENTION

This invention relates generally to pulse amplifying and shaping circuits and more particularly to an improved circuit of this kind for use as a gate driver for a periodically triggered thyristor.

Many electronic circuits and apparatus employ solid-state controllable switching devices known as thyristors or silicon controlled rectifiers (SCRs). A thyristor is typically a three-electrode device having an anode, a cathode, and a control or gate terminal. When its anode and cathode are externally connected in series with an electric power load and a source of forward anode voltage (i.e., anode potential is positive with respect to cathode), a thyristor will ordinarily block appreciable load current until a firing signal of appropriate amplitude and duration is applied to the control terminal, whereupon it switches from its blocking or "off" state to a conducting or "on" state in which the ohmic value of the anode-to-cathode resistance is very low. To generate the firing signal required to trigger a high-power thyristor, it is common practice to use a gate driver that is activated by a command or gating signal which in turn is supplied by associated control means. The criteria for designing a gate driver are well known in the art-see, for example, the chapter entitled "Gate Trigger Characteristics, Ratings, and Methods" on pages 71-122 of the SCR Manual (Fifth Ed., 1972) published by the General Electric Company (Electronics Park, Syracuse, N.Y.). Generally speaking the waveform of the firing signal should be characterized by a sharply rising front, a high amplitude, and a sufficient length (duration) to ensure successful turn on of the thyristor when commanded by the control means.

In many practical applications a thyristor is triggered by a single pulse-like firing signal having a very fast rise time, a high amplitude, and a relatively short duration (of the order of 25 microseconds or less). When only a single pulse is required, it is not difficult to design a gate driver for such applications. For example, in a known gate driver of this type a precharged capacitor is discharged through the primary winding of a pulse transformer so that the secondary current (which is the firing signal) rises abruptly to a relatively high peak, and a series LC circuit is connected across the capacitor so that its subsequent discharge will slightly broaden this pulse of current. In other applications, a thyristor requires a firing signal having a much longer duration (e.g., longer than 1 millisecond). In this case the initial rise time of the firing signal is not critical and can be relatively slow, and gate drivers using long pulse width transformers or known filtering techniques to prolong or sustain the firing signal can therefore be applied.

In some cases a combination of short single pulse and long sustained firing signals is needed. An example of this requirement is found in co-pending U.S. patent application Ser. No. 035,352 filed concurrently herewith for R. B. Bailey and T. D. Stitt and assigned to the General Electric Company, which application discloses a chopper type electric propulsion system for d-c traction motors. For reasons that are explained in the referenced patent application, in normal operation the main thyristor of the chopper is periodically fired in response to gating signals of relatively short duration (approximately 10 microseconds) that recur at either a constant frequency (300 Hz) or a variable frequency that is lower than the constant frequency, but to turn on the chopper at the beginning of an electrical braking mode of operation of the propulsion system, the main thyristor is initially triggered by an extended firing signal generated in response to a 2-millisecond burst of high frequency (e.g., 21.6 KHz) discrete pulses (10 to 20 microseconds each). In this case the use of prior art techniques in the gate driver to obtain the extended firing signal is not practical because the resulting retardation of rise time would be unsatisfactory in normal operation. Other known pulse shaping circuits that can generate extended firing signals are not ideal for dual-purpose gate drivers because of one or more of the following shortcomings: electrical isolation between control and power circuits is insufficient, an a-c control power source is required, cost is too high, or initial rise time is too slow.

SUMMARY OF THE INVENTION

Accordingly, it is a general objective of the present invention to provide an improved pulse amplifying and shaping circuit useful in a dual purpose gate driver that can successfully provide either a single fast rising short duration firing signal or an extended firing signal of much longer duration.

Another objective of the invention is the provision of a relatively simple and low cost pulse shaping circuit that enables a gate driver to generate a continuous firing signal having a fast rise time in response to a burst of high frequency gating signals.

A more specific objective is to provide a pulse shaping circuit well suited for practical application in the gate driver for the main thyristor of the electric power chopper that is used in the propulsion system disclosed in the above-cited copending patent application Ser. No. 035,352.

In carrying out the invention in one form, there is provided a capacitor in series with the primary winding of a pulse transformer, and the capacitor is also connected through an inductor to an d-c power supply from which it accumulates a charge. Normally open switching means is connected in parallel with the primary winding and the capacitor, and means for periodically closing the switching means is provided. When the switching means is closed, it conducts discharge current from the precharged capacitor through the primary winding of the pulse transformer, and it also conducts current from the d-c power supply through the inductor. Subsequently, when the switching means is next opened, current in the inductor will flow through the primary winding and assist the recharging of the capacitor. A secondary winding of the pulse transformer is connected through full wave rectifier means to a pair of d-c output terminals adapted to be connected to the gate and cathode of a thyristor. The rectifier means includes a first diode connected between the secondary winding and one of the output terminals for conducting gate-to-cathode current when the precharged capacitor is discharging through the primary winding, and a second diode connected between the secondary winding and the same output terminal for conducting gate current when capacitor recharging current is flowing in the primary winding. A third diode is connected in series with the second diode, and a second capacitor is connected between the junction of the second and third diodes and the other output terminal, whereby the second capacitor is charged during the recharging intervals of the capacitor on the primary side of the pulse transformer. Consequently the second capacitor does not impede the rise time of the gate-to-cathode current when the switching means is initially closed. If the switching means is repetitively closed and opened at a sufficiently high frequency, the charge on the second capacitor will supply gate current during the short intervals when the transformer primary current is low or crossing zero, thereby ensuring continuous gate current after the first half cycle of high frequency operation.

The invention will be better understood and its various objects and advantages will be more fully appreciated from the following description taken in conjunction with the accompanying drawing.

DESCRIPTION OF THE PREFERRED EMBODIMENT

Figure 1:
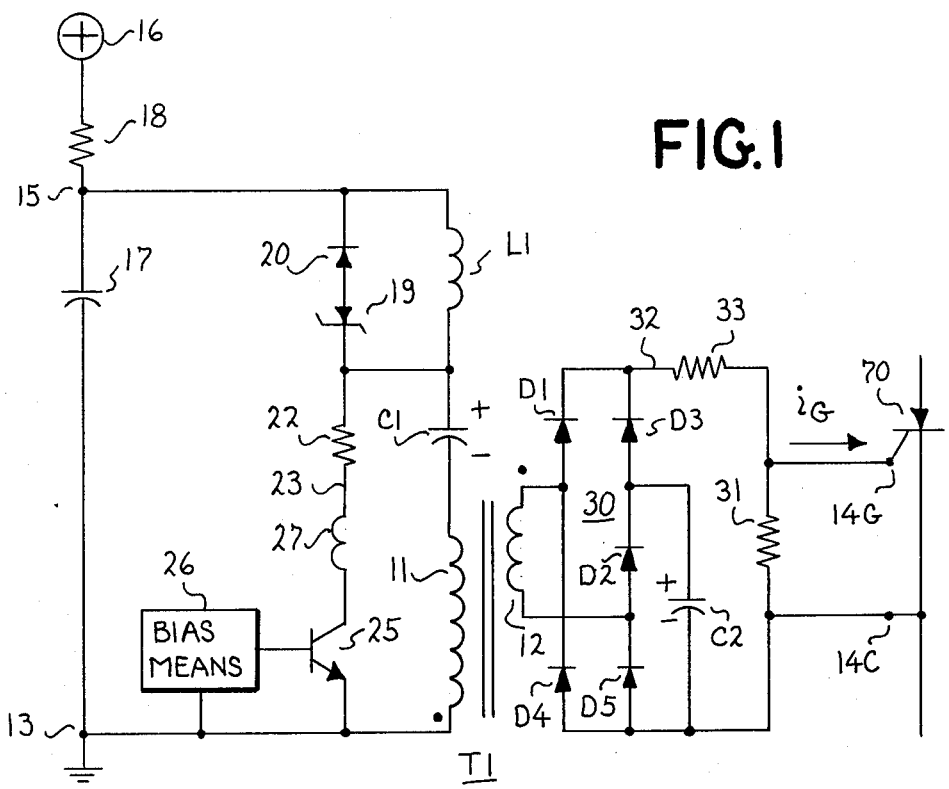
FIG. 1 is a schematic circuit diagram of a pulse shaping circuit embodying the present invention.

The pulse shaping circuit comprises a pulse transformer T1 having a primary winding 11 and at least one secondary winding 12. Preferably the primary winding 11 has twice the number of turns as the secondary winding 12. The dot end of the primary 11 is connected to an input terminal 13 at ground potential. A capacitor C1 is connected to the other end of the primary, and the series combination of the primary winding 11 and the capacitor C1 is connected via an inductor L1 to a relatively positive input terminal 15 that is adapted to be connected to a source of d-c control power from which the capacitor C1 accumulates charge. The d-c control power source includes a battery or the like (not shown) whose negative terminal is connected to ground and whose positive terminal is connected to a terminal 16, and it should have a relatively high voltage (e.g., 100 volts). In FIG. 1 a filter capacitor 17 of relatively large capacitance value (e.g., 50 microfarads) and a series resistor 18 are shown connected between the positive control power terminal 16 and the grounded terminal 13, and the input terminal 15 is the junction of this capacitor and resistor.

A voltage clipping circuit comprising back-to-back diodes 19 and 20 is connected across the inductor L1. As is shown symbolically in FIG. 1, the diode 19 is preferably a zener diode.

The relatively positive plate of the capacitor C1 is connected through a current limiting resistor 22 of small ohmic value (e.g., 20 ohms) and an input line 23 to the collector of an NPN transistor 25 whose emitter is grounded. Thus the transistor 25 is connected in parallel with the capacitor C1 and the primary winding 11. This transistor is normally biased off by associated bias means 26, and it serves as a normally open switching means in the pulse shaping circuit of FIG. 1. The transistor 25 can be physically located remotely from the other components of the illustrated circuit, in which case the line 23 has measurable inductance which is shown symbolically at 27. Whenever the bias means 26 is commanded to forward bias the base-emitter junction of the transistor 25, this device switches to a turned on or closed state, and while it remains closed the collector current in line 23 comprises a gating signal for activating the pulse shaping circuit.

The bias means 26 is suitably controlled so as periodically to turn on the transistor 25. A practical example of means for determining the timing of the turned on periods of this transistor is shown and described in the above-cited concurrently filed patent application Ser. No. 035,352. The transistor that is herein identified by the reference number 25 corresponds to transistor 255 in the referenced application. In normal operation it is turned on for a short period of approximately 10 microseconds at a maximum repetitive rate or frequency of the order of 300 Hz, but occasionally, in response to a burst firing signal of approximately 2-millisecond duration at the beginning of electrical braking of the propulsion system disclosed in the referenced application, the transistor is turned on for the same short period at a much higher frequency (e.g., 21.6 KHz). As will soon be apparent, the pulse shaping circuit of the present invention will respond equally well to either situation by generating an appropriate firing signal for a thyristor 70.

The secondary winding 12 of the pulse transformer T1 is connected through full-wave rectifier means 30 to a pair of d-c output terminals 14C and 14G. These output terminals are coupled to a load circuit comprising the cathode and gate terminals of a thyristor 70 that is connected in an electric power circuit such as a chopper (not shown). A resistor 31 connected across the output terminals provides noise immunity and improves the dv/dt capability of the thyristor 70. Between a conductor 32 on the relatively positive side of the rectifier means 30 and the output terminal 14G there is a series resistor 33 that promotes current sharing between the secondary circuit that is illustrated in FIG. 1 and additional secondary circuits that can be coupled to the same transformer primary winding 11.

As is shown in FIG. 1, the rectifier means 30 comprises a first diode D1 connected between the dot end of the transformer secondary winding 12 and the conductor 32 and poled to conduct current from the dot end to the conductor 32, second and third serially interconnected diodes D2 and D3 connected between the opposite end of the secondary winding and the conductor 32 and poled to conduct current from the opposite end to the conductor 32, a fourth diode D4 connected between the dot end of the secondary and the output terminal 14C and poled to conduct current from this terminal to the dot end of the secondary, and a fifth diode D5 connected between the opposite end of the secondary winding 12 and the same output terminal 14C and poled similarly to diode D4. A capacitor C2 is connected between the output terminal 14C and the junction of the second and third diodes D2 and D3. The charging path of this capacitor includes diodes D2 and D4, and the discharging path includes the diode D3, the resistor 33, and the gate-cathode junction of the thyristor 70.

The operation of the pulse shaping circuit will now be described. The transistor 25 is normally in a turned off or open state, and usually the capacitor C1 is precharged to the steady-state voltage level of the d-c control power source (100 volts) with the polarity shown in FIG. 1. When the transistor is turned on or closed, it provides a low-resistance path for discharging the capacitor C1 through the primary winding 11 of the pulse transformer T1, and at the same time it also conducts current from the positive input terminal 15 through the inductor L1.

When the fully precharged capacitor C1 is thus switched across the transformer primary 11 (in series with the line 23), its discharge current rises steeply to a relatively high peak in the primary winding. The resulting "positive" half cycle of secondary current is conducted through the diodes D1 and D5 and the gate-cathode junction of the thyristor 70, and this current is therefore the desired fast-rising single-pulse firing signal $i_G$ for triggering the thyristor 70. Its rise time is not impeded by the capacitor C2 because the diode D3 prevents this capacitor from charging during the positive half cycles of secondary current. The capacitance value of the capacitor C1 (e.g., 1 microfarad) is selected so that during the conducting period (e.g., approximately 10 microseconds) of the transistor 25 this capacitor will not fully discharge and its voltage will not fall below a predetermined level (e.g., 20 volts) at which the magnitude of current $i_G$ in the transformer secondary would fall below the minimum gate trigger current (e.g., 0.3 ampere) of the thyristor 70. This ensures that the magnitude of the initial pulse of secondary current is higher than the minimum gate trigger current throughout the conducting period of the transistor 25.

When the transistor 25 changes to its normally open state at the end of the above-described conducting period, the current in the inductor L1 transfers from this transistor to the capacitor C1 and the primary winding 11, and it assists the subsequent recharging of the capacitor C1. The recharging current flows from the positive terminal 15 and through inductor L1, the capacitor C1, and the transformer primary 11 to the grounded terminal 13. In the transformer primary its direction is reverse to that of the discharging current. A finite time, which can be referred to as the commutation time, is required for the current in inductor L1 to transfer from the transistor 25 to the primary winding 11 when the transistor is turned off, and during this time the transformer secondary current decreases to zero and increases with opposite polarity. While there is recharging current in the transformer primary, a "negative" half cycle of secondary current is conducted through the diodes D2, D3, and D4 and the thyristor gate. This negative half cycle has a lower amplitude but a longer duration than the preceeding positive half cycle of secondary current. During the negative half cycle some of the current in diodes D2 and D4 is diverted into the capacitor C2 which is charged thereby. Later, during intervals when the potential of line 32 is lower than the potential on its positive plate, this capacitor will discharge into the thyristor gate.

The inductance value of the inductor L1 (e.g., 1 millihenry) is selected so that at the end of the 10-microsecond conducting period of the transistor 25 the current in L1 will have built up to at least a predetermined minimum magnitude which is about equal to the magnitude of capacitor discharge current than flowing in the transformer primary winding 11 (e.g., approximately 0.5 ampere) and so that during an ensuing non-conducting interval of a predetermined duration the recharging current of the capacitor C1 will not decay below this predetermined minimum magnitude. This ensures that the magnitude of the second half cycle of secondary current is above the minimum gate trigger current of the thyristor 70 for at least as long as said predetermined duration. Preferably the predetermined duration of the non-conducting interval of the transistor 25 is of the order of 40 microseconds or less. Consequently, if the 10-microsecond conducting periods of the transistor 25 are repeated at a frequency of 20 KHz or higher, the illustrated pulse shaping circuit is operative, after its initial half cycle, to supply a continuous gate current $i_G$ to the thyristor 70. The extended firing signal that the pulse shaping circuit supplies to the thyristor during the first three cycles of its operation in this burst firing mode is illustrated in FIG. 2.

Figure 2:
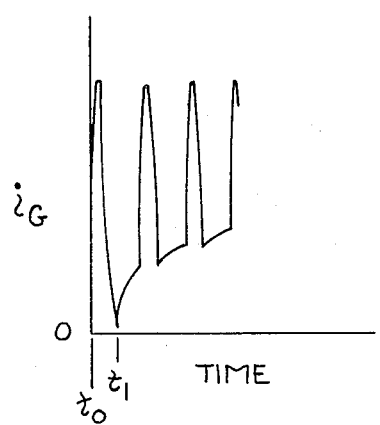
FIG. 2 is a diagram of the waveform of the output current that is generated by the FIG. 1 circuit during the initial few cycles of operation in a burst firing mode.

At time $t_0$ in FIG. 2 the transistor 25 is initially turned on, and the resulting discharge of the precharged capacitor C1 produces a steep-rising high-amplitude pulse of gate current $i_G$ which is not impeded by the capacitor C2. At the end of the first conducting period of the transistor 25, current in the transformer primary winding decreases to zero and reverses direction as the capacitor C1 stops discharging through the transistor and commences recharging through the inductor L1. The first zero crossing of transformer primary current occurs at time $t_1$, and as is shown in FIG. 2 the gate current momentarily decreases to zero at the same time. During the ensuing non-conducting interval, the capacitor C1 is being recharged and the negative half cycle of the transformer secondary current serves as the gate signal $i_G$. The second capacitor C2 accumulates a charge during this negative half cycle of secondary current.

When the transistor 25 is turned on for the second time in this burst firing mode of operation, current in the transformer primary winding will again decrease to zero and reverse direction as the capacitor C1 stops recharging through the inductor L1 and commences discharging through the transistor, but there is no corresponding decrease of $i_G$ because the capacitor C2 is now charged and will supply gate current during the short commutation time when the transformer primary current is low or crossing zero. The gate current is quickly driven to another high peak as the capacitor C1 discharges through the transformer primary and the transistor 25 during the second conducting period of the transistor. At the conclusion of the second conducting period, the capacitor C2 is again able to supply gate current while the transformer primary current is crossing zero. The gate current waveform will continue generally as shown in FIG. 2 throughout the remainder of the burst firing mode of operation, with some loss of amplitude due to the partial discharge of the filter capacitor 17 during the burst firing interval.

In the illustrated embodiment of the invention, the capacitive value of the capacitor C2 (e.g., 2.2 microfarads) is selected so that the time constant of the discharging path of this component is longer than the commutation time of the transformer primary winding 11. As previously mentioned, this commutation time is the time required for the current in the inductor L1 to transfer from the transistor 25 to the primary winding 11 when the transistor changes from its closed state to its normally open state. In practical embodiments of the invention, a time constant of the order of 3 to 5 microseconds is contemplated.

While a preferred embodiment of the invention has been shown and described by way of example, many modifications will undoubtedly occur to persons skilled in the art. The concluding claims are therefore intended to cover all such modifications as fall within the true spirit and scope of the invention.

What I claim as new and desire to secure by Letters Patent of the United States is:

1. In combination:
   (a) a pair of input terminals adapted to be connected to a source of d-c power;

(b) a transformer having a primary winding and at least one secondary winding;

(c) a first capacitor connected in series with said primary winding;

(d) means including an inductor for connecting the series combination of said primary winding and said first capacitor to said input terminals, whereby said first capacitor accumulates a charge from said source of d-c power;

(e) normally open switching means connected in parallel with said primary winding and said first capacitor, said switching means being periodically switched to a closed state in which it conducts discharge current from the first capacitor through said primary winding and also conducts current from said source of d-c power through said inductor;

(f) a pair of d-c output terminals adapted to be connected to a load circuit;

(g) full wave rectifier means for connecting said secondary winding to said output terminals, said rectifier means including a first diode connected between said secondary winding and one of said output terminals for conducting load current when said capacitor discharge current is flowing in said primary winding, and second and third diodes serially connected between said secondary winding and said one output terminal for conducting load current when capacitor charging current is flowing in said primary winding; and (h) a second capacitor connected between the other output terminal and the junction of said second and third diodes.

2. The combination as set forth in claim 1 wherein said second capacitor has a charging path including said second diode and a discharging path including said third diode and the load circuit, and wherein the second capacitor has sufficient capacitance so that the time constant of its discharging path is longer than the time required for the current in said inductor to transfer from said switching means to said primary winding when said switching means changes from said closed state to its normally open state.

3. The combination as set forth in claim 1 wherein said first capacitor has sufficient capacitance so that it does not fully discharge during the period when said switching means is in a closed state, and wherein the inductance of said inductor is selected so that at the end of said period the magnitude of current in the inductor is approximately equal to the magnitude of capacitor discharge current in said primary winding.

4. The combination of claim 3 wherein said second capacitor has a charging path including said second diode and a discharging path including said third diode and the load circuit, and wherein the second capacitor has sufficient capacitance so that the time constant of its discharging path is longer than the time required for the current in said inductor to transfer from said switching means to said primary winding when said switching means changes from said closed state to its normally open state.

* * * * *